United States Patent
Zheng et al.

(10) Patent No.: US 10,551,429 B2
(45) Date of Patent: Feb. 4, 2020

(54) METHOD FOR DETECTING ANTI-ISLAND PROTECTION PERFORMANCE OF INVERTER

(71) Applicants: CHINA ELECTRIC POWER RESEARCH INSTITUTE, Beijing (CN); STATE GRID CORPORATION OF CHINA, Beijing (CN)

(72) Inventors: Fei Zheng, Beijing (CN); Mei Chen, Beijing (CN); Xiaolin Zhang, Beijing (CN); Junjun Zhang, Beijing (CN); Jingsheng Huang, Beijing (CN); Zhilei Chen, Beijing (CN); Wei Dong, Beijing (CN)

(73) Assignees: CHINA ELECTRIC POWER RESEARCH INSTITUTE, Beijing (CN); STATE GRID CORPORATION OF CHINA, Beijing (CN)

( * ) Notice: Subject to any disclaimer, the term of this patent is extended or adjusted under 35 U.S.C. 154(b) by 71 days.

(21) Appl. No.: 15/573,105

(22) PCT Filed: Aug. 31, 2015

(86) PCT No.: PCT/CN2015/088536
§ 371 (c)(1),
(2) Date: Nov. 9, 2017

(87) PCT Pub. No.: WO2016/179928
PCT Pub. Date: Nov. 17, 2016

(65) Prior Publication Data
US 2018/0164367 A1    Jun. 14, 2018

(30) Foreign Application Priority Data
May 14, 2015   (CN) .......................... 2015 1 0245792

(51) Int. Cl.
*G01R 31/28* (2006.01)
*H02J 3/38* (2006.01)
*H02M 7/5395* (2006.01)

(52) U.S. Cl.
CPC .......... *G01R 31/2827* (2013.01); *H02J 3/383* (2013.01); *H02J 3/385* (2013.01);
(Continued)

(58) Field of Classification Search
CPC ............ H02J 3/383; H02J 3/385; G01R 31/00
See application file for complete search history.

(56) References Cited

U.S. PATENT DOCUMENTS 9,124,095 B1 * 9/2015 Barron .................. H02H 7/122
2013/0114302 A1  5/2013 Escobar et al.
(Continued)

FOREIGN PATENT DOCUMENTS

CN       102590713 A    7/2012
CN       103117554 A    5/2013
(Continued)

*Primary Examiner* — Alvaro E Fortich
(74) *Attorney, Agent, or Firm* — Platinum Intellectual Property LLP (57) ABSTRACT

The present invention provides a method for detecting the anti-island protection performance of an inverter. An RLC circuit is serially connected between the inverter and a grid connection switch, the resonant frequency of the RLC load is set as three different numerical values for enabling the same to present resistance, capacitance and inductance, and a time value from the disconnection of the grid connection switch to the operation stop of the inverter under detection is recorded after a fundamental current value of the grid connection switch is set to a different value each time; and weighted calculation is performed on the time value to obtain a test result and grade evaluation of the anti-island protection ability of the inverter. By adoption of the detection method provided by the present invention, the problem (Continued)

that the anti-island protection ability of the photovoltaic inverter is difficult to precisely evaluate is solved; the anti-island protection performance of the inverter is comprehensively and objectively reflected; and meanwhile the phenomenon that a part of inverters cannot correctly reflect the anti-island ability of the inverters with respect to characteristic load design is effectively avoided, a technical support is provided for the existing method for detecting the anti-island protection performance, and related standard systems in the field of detection of the anti-island protection performance are further enriched and perfected.

6 Claims, 4 Drawing Sheets

(52) U.S. Cl.
CPC ...... *H02J 2003/388* (2013.01); *H02M 7/5395* (2013.01); *Y02E 10/563* (2013.01)

(56) References Cited

U.S. PATENT DOCUMENTS

| | | | |
|---|---|---|---|
| 2014/0146427 A1* | 5/2014 | Huang | H02H 1/0061 361/83 |
| 2014/0152331 A1 | 6/2014 | Wagoner et al. | |
| 2015/0244251 A1* | 8/2015 | Chen | H02J 3/38 363/55 |
| 2016/0285268 A1* | 9/2016 | Majumder | H02J 3/38 |
| 2016/0301328 A1* | 10/2016 | Farese | H02J 3/382 |

FOREIGN PATENT DOCUMENTS

| | | |
|---|---|---|
| CN | 103323695 A | 9/2013 |
| CN | 103645404 A | 3/2014 |
| CN | 103983880 A | 8/2014 |
| CN | 104578861 A | 4/2015 |
| EP | 2590291 A1 | 5/2013 |

\* cited by examiner

METHOD FOR DETECTING ANTI-ISLAND PROTECTION PERFORMANCE OF INVERTER

FIELD OF THE INVENTION

The present invention relates to the field of detection of photovoltaic grid-connected inverters, and in particular to a method for detecting the anti-island protection performance of an inverter.

BACKGROUND OF THE INVENTION

When a public power grid suddenly stops supplying power, a distributed photovoltaic power generation system connected with the power grid cannot detect the power failure state of the power grid in time and continues working, thereby forming a self-powered island. The photovoltaic power generation system will produce serious consequences in an island operation state, for example, the voltage and frequency in the island cannot be controlled, which may damage users' equipment; a circuit in the island is still electrified, which may endanger the personal safety of maintenance personnel; the action timing sequence of protection switches of the power grid system is affected; and when the electric power company recovers the power supply, a large impact current is generated due to phase asynchrony, and so on. At present, corresponding anti-island protection performance detection standards and detection flows are formulated both at home and abroad.

At present, in the field of anti-island protection performance detection at home and abroad, only the magnitude and a single interval of fundamental current flowing through a grid connection switch are considered in initial test conditions, resulting in that a part of inverters cannot correctly reflect the anti-island ability of the inverters with respect to characteristic load design; and meanwhile the anti-island protection performance of the inverters cannot be comprehensively and precisely reflected.

SUMMARY OF THE INVENTION

In view of this, the present invention provides a method for detecting the anti-island protection performance of an inverter for solving the problem that the anti-island protection ability of the photovoltaic inverter is difficult to precisely evaluate; the anti-island protection ability of the inverter is comprehensively and objectively reflected; and meanwhile the phenomenon that a part of inverters cannot correctly reflect the anti-island ability of the inverters with respect to characteristic load design is effectively avoided, a technical support is provided for the existing method for detecting the anti-island protection performance, and related standard systems in the field of detection of the anti-island protection performance are further enriched and perfected.

It can be seen from the above technical solution that the present invention provides a method for detecting the anti-island protection performance of an inverter. An RLC circuit is serially connected between the inverter and a grid connection switch, the resonant frequency of the RLC load is set as different numerical values for enabling the same to present resistance, capacitance and inductance, the time value from the disconnection of the grid connection switch to the operation stop of the inverter under detection is recorded after a fundamental current value of the grid connection switch is set to a different value each time; and weighted calculation is performed on the time value to obtain a test result and grade evaluation of the anti-island protection ability of the inverter. By adoption of the detection method provided by the present invention, the problem that the anti-island protection ability of the photovoltaic inverter is difficult to precisely evaluate is solved; the anti-island protection performance of the inverter is comprehensively and objectively reflected; and meanwhile the phenomenon that a part of inverters cannot correctly reflect the anti-island ability of the inverters with respect to characteristic load design is effectively avoided, a technical support is provided for the existing method for detecting the anti-island protection performance, and related standard systems in the field of detection of the anti-island protection performance are further enriched and perfected.

Compared with the closest prior art, the technical solution provided by the present invention has the following excellent effects:

1. In the technical solution provided by the present invention, the influence on the time for detecting the anti-island protection performance of the inverter in the initial conditions is fully considered, when the magnitude of the fundamental current flowing through the grid connection switch is respectively within three variation intervals of 0-1%, 1-3% and 3-5% of the output current of the inverter, and as the fundamental current flowing through the grid connection switch is divided into three different intervals, the anti-island protection performance of the inverter can be reflected more objectively.

2. In the technical solution provided by the present invention, as a resonance change of the RLC load is introduced into the method for detecting the anti-island protection performance of the inverter, the anti-island protection performance of the inverter can be detected comprehensively and effectively, and thus the reliability of detection is improved.

3. In the technical solution provided by the present invention, as three resonant frequency intervals representing resistance, capacitance and inductance are introduced to serve as key test conditions, and a precise test of the anti-island ability of the inverter is performed in 9 test intervals, thereby effectively avoiding the phenomenon that a part of inverters cannot correctly reflect the anti-island ability of the inverters with respect to one or more characteristic load designs, and improving the accuracy of detection.

4. In the technical solution provided by the present invention, weighted comprehensive evaluation is performed on 9 test results on the basis of precise detection to solve the problem that the anti-island protection ability of the photovoltaic inverter is difficult to precisely evaluate for the first time.

5. In the technical solution provided by the present invention, a technical support is provided for the existing method for detecting the anti-island protection performance, and related standard systems in the field of detection of the anti-island protection performance are further enriched and perfected.

6. The technical solution provided by the present invention has a wide application range and has significant social and economic benefits.

DETAILED DESCRIPTION OF THE EMBODIMENTS

A clear and complete description of technical solutions in the embodiments of the present invention will be given below, in combination with the accompanying drawings in the embodiments of the present invention. Apparently, the embodiments described below are merely a part, but not all, of the embodiments of the present invention. All of other embodiments, obtained by those of ordinary skill in the art based on the embodiments of the present invention without any creative effort, fall into the protection scope of the present invention.

Figure 1:
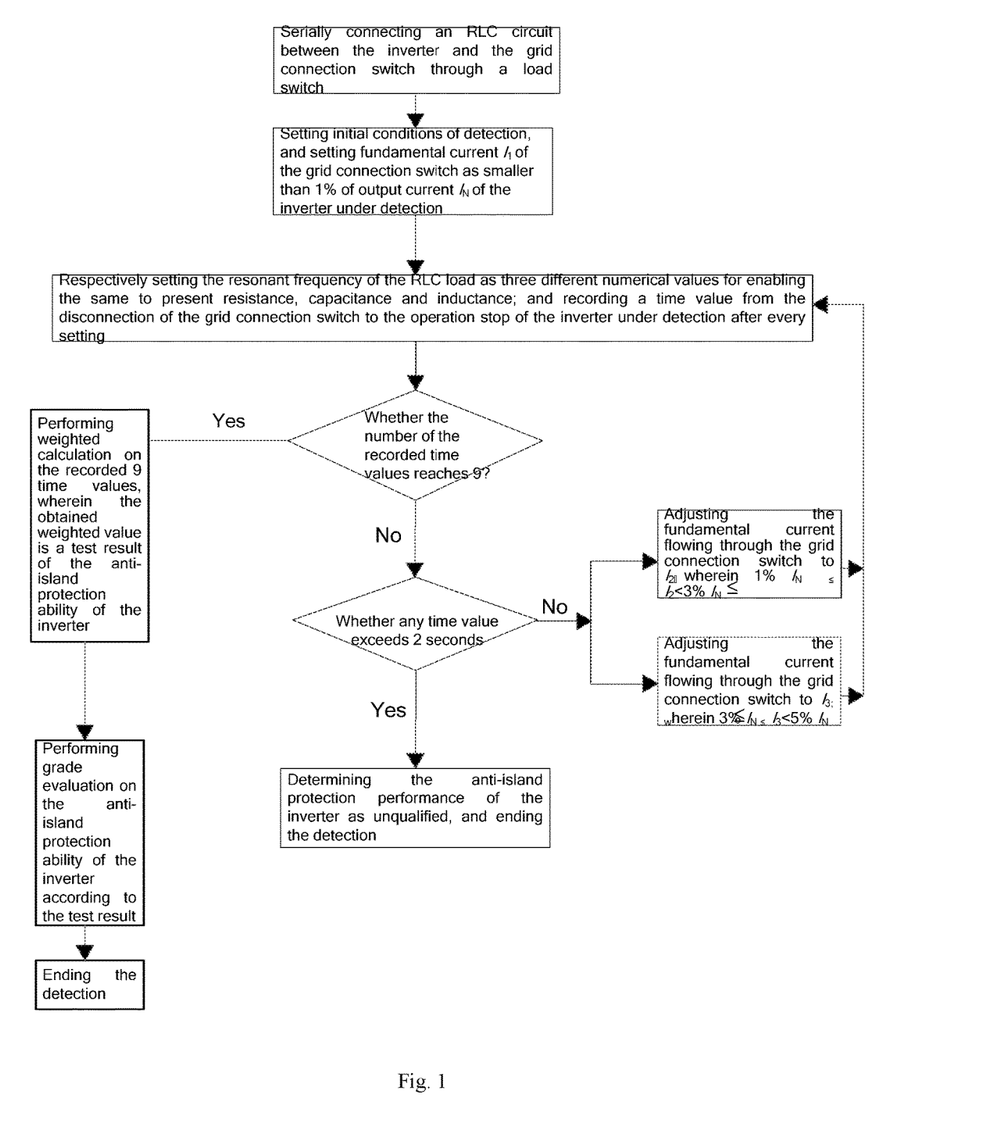
FIG. 1 is a flowchart of a method for detecting the anti-island protection performance of an inverter of the present invention.

As shown in FIG. 1, the present invention provides a method for detecting the anti-island protection performance of an inverter, the inverter to be detected is connected to a power distribution network through a closed grid connection switch K2, and the method includes the following steps:

step 1, serially connecting an RLC circuit between the inverter and the grid connection switch K2 through a load switch, wherein the RLC load includes an inductor, a capacitor and a resistor, which are connected in parallel;

step 2, setting initial conditions of detection, and setting fundamental current $I_1$ of the grid connection switch K2 as smaller than 1% of output current $I_N$ of the inverter under detection;

step 3, respectively setting the resonant frequency of the RLC load as three different numerical values for enabling the same to present resistance, capacitance and inductance; and recording a time value from the disconnection of the grid connection switch K2 to the operation stop of the inverter under detection after every setting;

step 4, if any of the time values exceeds 2 seconds, determining the anti-island protection performance of the inverter as unqualified, and ending the detection;

if the time value does not exceed 2 seconds, respectively adjusting the fundamental current flowing through the grid connection switch K2 to $I_2$ and $I_3$; and repeating step 1 to step 3 after every adjustment, until the number of the recorded time values is 9, wherein 1% $I_N \leq I_2 < 3\%$ $I_N$, 3% $I_N \leq I_3 < 5\%$ $I_N$; and step 5, performing weighted calculation on the recorded 9 time values, wherein the obtained weighted value is a test result of the anti-island protection ability of the inverter, and performing grade evaluation on the anti-island protection ability of the inverter according to the test result.

Prior to step 2, the method includes:
connecting a power test device between the grid connection switch K2 and the power distribution network.

The initial conditions of detection in step 2 further include:

2-1, measuring output values of active power and reactive power of the inverter by using the power detection device;

2-2, setting a reactive power value consumed by an LC circuit composed of an L branch and a C branch connected in parallel in the RLC circuit to be equal to the reactive power value emitted by the inverter; and setting an active power value consumed by the RLC circuit to be equal to the active power value emitted by the inverter; and 2-3, setting a quality factor of the RLC load as 1±0.2.

The three different resonant frequency values of the RLC load are respectively $f_1$ for enabling the RLC load to present resistance, $f_2$ for enabling the RLC load to present capacitance and $f_3$ for enabling the RLC load to present inductance; and 49.9 Hz$\leq f_1 <$50.1 Hz, 50.1 Hz$\leq f_2 <$50.2 Hz and 47.5 Hz$\leq f_3 <$49.9 Hz.

When the fundamental current $I_1$ of the grid connection switch K2 is smaller than 1% of the output current $I_N$ of the inverter under detection, the recording the time values $t_1$, $t_2$ and $t_3$ from the disconnection of the grid connection switch K2 to the operation stop of the inverter under detection includes:

3-1, when the resonant frequency value of the RLC load is $f_1$, disconnecting the grid connection switch K2, recording the time value $t_1$ from the disconnection of the grid connection switch K2 to the operation stop of the inverter, and closing the grid connection switch K2; if $t_1 >$2s, ending the test, the inverter not satisfying the GB/T29319 Technical specification for accessing photovoltaic power generation system to power distribution network; and if $t_1 \leq$2s, proceeding to 3-2;

3-2, when the resonant frequency value of the RLC load is $f_2$, disconnecting the grid connection switch K2, recording the time value $t_2$ from the disconnection of the grid connection switch K2 to the operation stop of the inverter, and closing the grid connection switch K2; if $t_2 >$2s, ending the test, the inverter not satisfying the GB/T29319 Technical specification for accessing photovoltaic power generation system to power distribution network; and if $t_2 \leq$2s, proceeding to 3-3;

3-3, when the resonant frequency value of the RLC load is $f_3$, disconnecting the grid connection switch K2, recording the time value $t_3$ from the disconnection of the grid connection switch K2 to the operation stop of the inverter, and closing the grid connection switch K2; if $t_3 >$2s, ending the test, the inverter not satisfying the GB/T29319 Technical specification for accessing photovoltaic power generation system to power distribution network; and if $t_3 \leq$2s, proceeding to 4-1;

wherein when the fundamental current of the grid connection switch K2 is $I_2$, and 1% $I_N \leq I_2 <$3%, recording the time values $t_4$, $t_5$ and $t_6$ from the disconnection of the grid connection switch K2 to the operation stop of the inverter under detection includes:

4-1, when the resonant frequency value of the RLC load is $f_1$, disconnecting the grid connection switch K2, recording the time value $t_4$ from the disconnection of the grid connection switch K2 to the operation stop of the inverter, and closing the grid connection switch K2; if $t_4 >$2s, ending the test, the inverter not satisfying the GB/T29319 Technical specification for accessing photovoltaic power generation system to power distribution network; and if $t_4 \leq 2s$, proceeding to 4-2;

4-2, when the resonant frequency value of the RLC load is $f_2$, disconnecting the grid connection switch K2, recording the time value $t_5$ from the disconnection of the grid connection switch K2 to the operation stop of the inverter, and closing the grid connection switch K2; if $t_5 > 2s$, ending the test, the inverter not satisfying the GB/T29319 Technical specification for accessing photovoltaic power generation system to power distribution network; and if $t_5 \leq 2s$, proceeding to 4-3;

4-3, when the resonant frequency value of the RLC load is $f_3$, disconnecting the grid connection switch K2, recording the time value $t_6$ from the disconnection of the grid connection switch K2 to the operation stop of the inverter, and closing the grid connection switch K2; if $t_6 > 2s$, ending the test, the inverter not satisfying the GB/T29319 Technical specification for accessing photovoltaic power generation system to power distribution network; and if $t_6 \leq 2s$, proceeding to 5-1;

wherein when the fundamental current of the grid connection switch K2 is $I_3$, and 3% $I_N \leq I_3 < 5\% I_N$, recording the time values $t_7$, $t_8$ and $t_9$ from the disconnection of the grid connection switch K2 to the operation stop of the inverter under detection includes:

5-1, when the resonant frequency value of the RLC load is $f_1$, disconnecting the grid connection switch K2, recording the time value $t_7$ from the disconnection of the grid connection switch K2 to the operation stop of the inverter, and closing the grid connection switch K2; if $t_7 > 2s$, ending the test, the inverter not satisfying the GB/T29319 Technical specification for accessing photovoltaic power generation system to power distribution network; and if $t_7 \leq 2s$, proceeding to 5-2;

5-2, when the resonant frequency value of the RLC load is $f_2$, disconnecting the grid connection switch K2, recording the time value $t_8$ from the disconnection of the grid connection switch K2 to the operation stop of the inverter, and closing the grid connection switch K2; if $t_8 > 2s$, ending the test, the inverter not satisfying the GB/T29319 Technical specification for accessing photovoltaic power generation system to power distribution network; and if $t_8 \leq 2s$, proceeding to 5-3;

5-3, when the resonant frequency value of the RLC load is $f_3$, disconnecting the grid connection switch K2, recording the time value $t_9$ from the disconnection of the grid connection switch K2 to the operation stop of the inverter, and closing the grid connection switch K2; if $t_9 > 2s$, ending the test, the inverter not satisfying the GB/T29319 Technical specification for accessing photovoltaic power generation system to power distribution network; and if $t_9 \leq 2s$, listing the recorded 9 time values in table 1:

TABLE 1 recording table of test results of the anti-island protection performance of the inverter

| Ratio of the fundamental current flowing through the grid connection switch to the output current of the inverter | The time for detecting the anti-island protection performance when the resonant frequency value of the RLC load is 49.9-50.1 Hz | The time for detecting the anti-island protection performance when the resonant frequency value of the RLC load is 50.1-50.2 Hz | The time for detecting the anti-island protection performance when the resonant frequency value of the RLC load is 47.5-49.9 Hz |
| --- | --- | --- | --- |
| <1% | $t_1$ | $t_2$ | $t_3$ |
| 1%-3% | $t_4$ | $t_5$ | $t_6$ |
| 3%-5% | $t_7$ | $t_8$ | $t_9$ |

The weighted value in step 5 is an average value or a root mean square value of the 9 time values.

The smaller the weighted value in step 5 is, the higher the grade evaluation of the anti-island protection ability of the inverter is.

In the application examples of the present invention, an inverter A and an inverter B which respectively adopt an existing typical active phase shift type anti-island protection method and active frequency shift type anti-island protection method are used as examples, anti-island simulation detection tests are performed on the two 100 kW photovoltaic grid-connected inverters in a Matlab/Simulink environment, and detection results of the anti-island protection performance of the inverters are recorded when different test working conditions, such as the resonant frequency and fundamental current variation of the load are simulated based on the impedance characteristics of the RLC circuit so as to evaluate the anti-island protection performance of the inverters.

Figure 2:
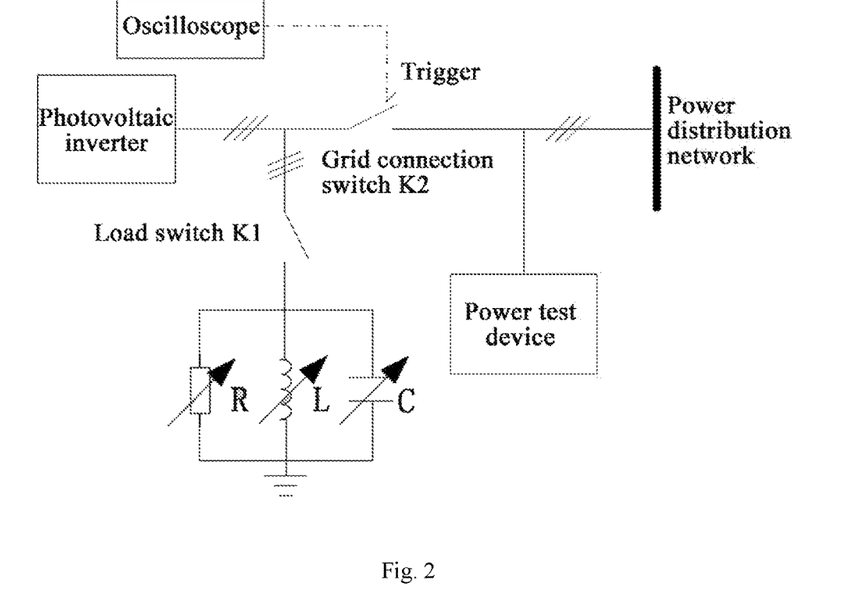
FIG. 2 is a wiring schematic diagram of a method for detecting the anti-island protection performance of an inverter in an embodiment of the present invention.
Figure 3:
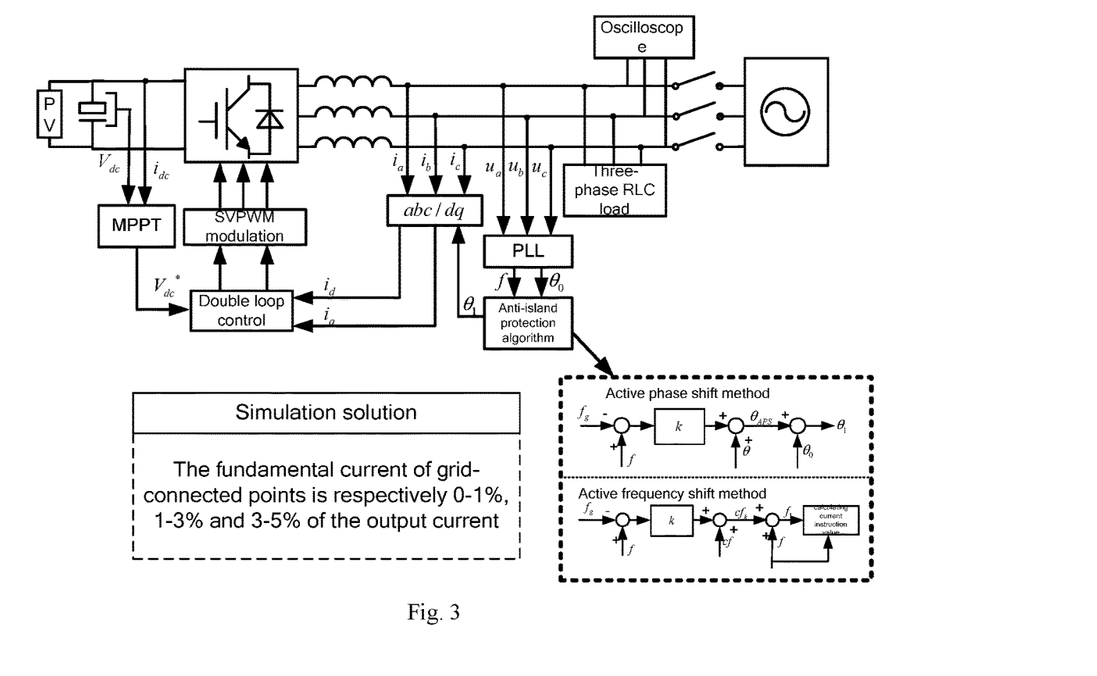
FIG. 3 is a schematic diagram of a simulation test solution of anti-island protection performance in an application example of the present invention.

As shown in FIGS. 2 and 3, the generation power of the photovoltaic grid-connected inverter is 100% rated power, the RLC load is configured, the load switch K1 and the grid connection switch K2 are closed, the magnitude of the fundamental current flowing through the grid connection switch K2 is respectively 0-1%, 1-3% and 3-5% of the output current of the photovoltaic inverter, and in the case that the magnitude of the fundamental current flowing through the K2 and the quality factor of the RLC load are invariable, the RLC load is adjusted to be capacitive, resistive and inductive respectively, namely the resonant frequency of the load is respectively 50.1 Hz-50.2 Hz, 49.9 Hz-50.1 Hz and 47.5 Hz-49.9 Hz, and the time for detecting the anti-island protection performance of the photovoltaic grid-connected inverter under the above-mentioned test conditions when the grid connection switch K2 is disconnected is recorded.

Figure 4:
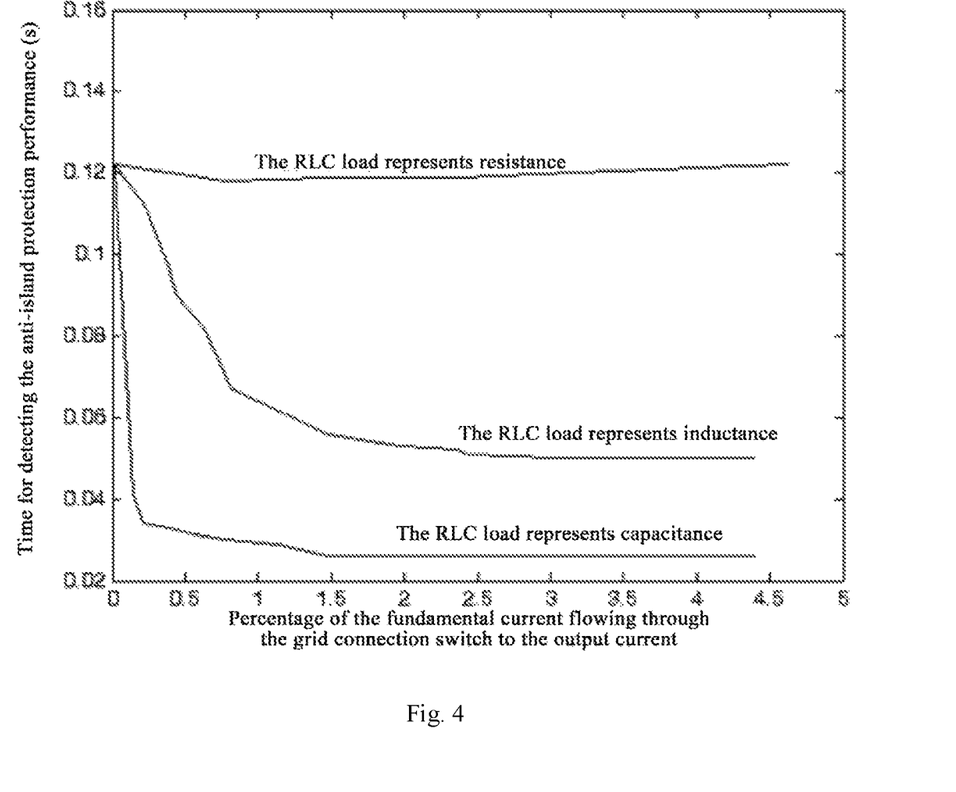
FIG. 4 is a tendency chart of time for detecting the anti-island protection performance of a particular photovoltaic inverter A under different load impedance characteristics in an application example of the present invention.

As shown in FIG. 4, when the inverter A adopts the active phase shift type anti-island protection method, and when the magnitudes of the fundamental current flowing through the grid connection switch K2 and the characteristics of the RLC load are different, it can be discovered from the detection result of the anti-island protection performance of the inverter that:

(1) when the RLC load represents resistance, the resonant frequency is 50 Hz, when the fundamental current flowing through the grid connection switch K2 is smaller than 5% of the output current, the magnitude of the fundamental current flowing through the grid connection switch K2 basically has no influence on the time for detecting the anti-island protection performance of the inverter.

(2) When the RLC load represents inductance, the resonant frequency is smaller than 50 Hz, when the fundamental current flowing through the grid connection switch K2 is smaller than 5% of the output current, the larger the fundamental current flowing through the grid connection switch K2 is, the further the resonant frequency deviating from 50 Hz is, the resonant frequency even exceeds 47.5 Hz specified by the standard, when the resonant frequency is between 47.5 Hz and 50 Hz, the time for detecting the anti-island protection performance is continuously shortened with the deviation of the resonant frequency from 50 Hz, and when the resonant frequency is smaller than 47.5 Hz, the time for detecting the anti-island protection performance is basically invariable.

(3) When the RLC load represents capacitance, the resonant frequency is greater than 50 Hz, when the fundamental current flowing through the grid connection switch K2 is smaller than 5% of the output current, the larger the fundamental current is, the further the resonant frequency deviating from 50 Hz is, the resonant frequency even exceeds 47.5 Hz specified by the standard, when the resonant frequency is between 50 Hz and 50.2 Hz, the time for detecting the anti-island protection performance is continuously shortened with the deviation of the resonant frequency from 50 Hz, and when the resonant frequency is greater than 50.2 Hz, the time for detecting the anti-island protection performance is basically invariable.

(4) The fundamental current with the same magnitude has the following phenomenon: when the load is resistive and when the resonant frequency is 50 Hz, the time for detecting the anti-island protection performance is the longest, when the load is capacitive or inductive, the resonant frequency deviates from 50 Hz, and the further the resonant frequency deviating from 50 Hz is, the shorter the detection time is, namely the possibility of a qualified detection result is greater, and the detection result is not objective.

Figure 5:
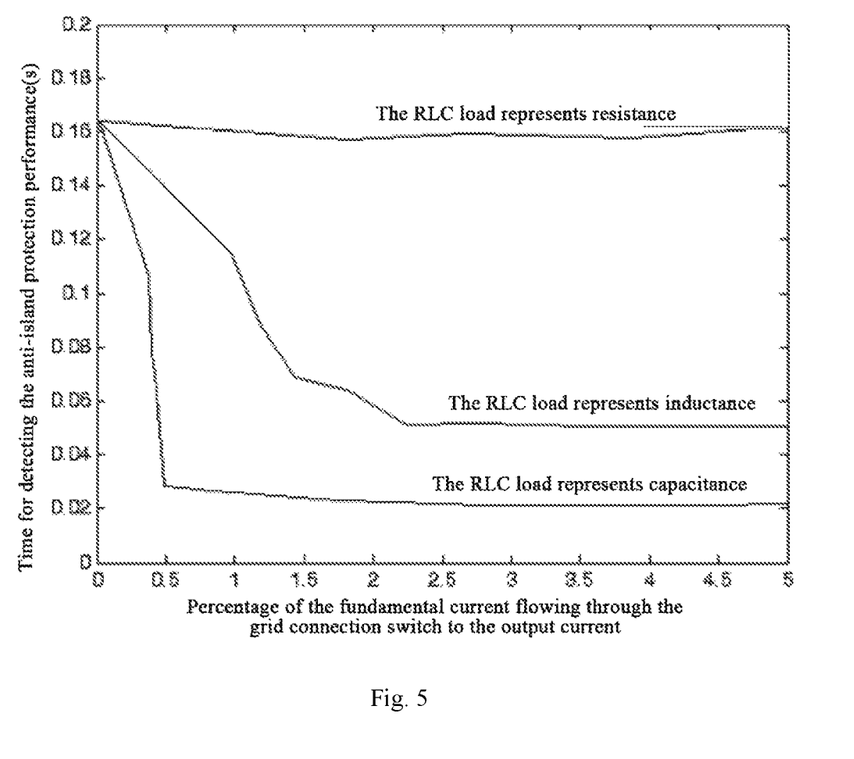
FIG. 5 is a tendency chart of time for detecting the anti-island protection performance of a particular photovoltaic inverter B under different load impedance characteristics in an application example of the present invention.

As shown in FIG. 5, when the inverter B adopts the active frequency shift type anti-island protection method, and when the magnitudes of the fundamental current flowing through the grid connection switch K2 and the characteristics of the RLC load are different, the experimental phenomena of the detection result of the anti-island protection performance of the inverter are similar to those of the detection result of the inverter A.

The anti-island ability of the two inverters mentioned above are evaluated, table 2 is a recording table of test results of anti-island ability of the inverter A, table 3 is a recording table of the test results of anti-island ability of the inverter B, weighted calculation is respectively performed on the test results of the two inverters to obtain that the evaluation value of the anti-island protection ability of the inverter A is 0.0719, and the evaluation value of the anti-island protection ability of the inverter B is 0.0972. It indicates that the anti-island protection ability of the inverter A is better than the anti-island protection ability of the inverter B.

TABLE 2 recording table of test results of anti-island ability of the inverter A

| Ratio of the fundamental current flowing through the grid connection switch to the output current of the inverter | The time for detecting the anti-island protection performance when the resonant frequency value of the RLC load is 49.9-50.1 Hz | The time for detecting the anti-island protection performance when the resonant frequency value of the RLC load is 50.1-50.2 Hz | The time for detecting the anti-island protection performance when the resonant frequency value of the RLC load is 49.5-49.9 Hz |
|---|---|---|---|
| <1% | 0.120 | 0.033 | 0.097 |
| 1%-3% | 0.119 | 0.029 | 0.052 |
| 3%-5% | 0.122 | 0.025 | 0.050 |

TABLE 3 recording table of test results of anti-island ability of the inverter B

| Ratio of the fundamental current flowing through the grid connection switch to the output current of the inverter | The time for detecting the anti-island protection performance when the resonant frequency value of the RLC load is 49.9-50.1 Hz | The time for detecting the anti-island protection performance when the resonant frequency value of the RLC load is 50.1-50.2 Hz | The time for detecting the anti-island protection performance when the resonant frequency value of the RLC load is 49.5-49.9 Hz |
|---|---|---|---|
| <1% | 0.165 | 0.061 | 0.142 |
| 1%-3% | 0.163 | 0.032 | 0.065 |
| 3%-5% | 0.165 | 0.025 | 0.057 |

As shown in FIGS. 4 and 5, compared with the existing standard for detecting the anti-island protection performance, the influence on the time for detecting the anti-island protection performance of the inverter in the initial conditions is fully considered, when the magnitude of the fundamental current flowing through the grid connection switch is respectively within the three variation intervals of 0-1%, 1-3% and 3-5% of the output current of the inverter, and the anti-island protection performance of the inverter can be reflected more comprehensively compared with that when 0-1%, 1-3% or 0-5% and other single intervals are considered in the existing standard. When the fundamental current flowing through the grid connection switch is determined as resistive, capacitive or inductive, and when the fundamental current flowing through the grid connection switch is smaller than 1% of the output current of the inverter, the time for detecting the anti-island protection performance of the inverter is quickly shortened with the increase of the fundamental current flowing through the grid connection switch; when the fundamental current flowing through the grid connection switch is 1%-3% of the output current of the inverter, the time for detecting the anti-island protection performance of the inverter is slowly shortened with the increase of the fundamental current flowing through the grid connection switch; and when the fundamental current flowing through the grid connection switch is 3%-5% of the output current of the inverter, the time for detecting the anti-island protection performance of the inverter is basically invariable with the increase of the fundamental current flowing through the grid connection switch. Therefore, for the inverter of the same model number, the power consumed by the impedance of the RLC load is different, the magnitude of the fundamental current flowing through the grid connection switch is different, and the time for detecting the anti-island protection performance of the inverter is inconsistent. During the detection of the anti-island protection performance of the inverter provided by the present invention, the fundamental current flowing through the grid connection switch is divided into three different intervals, namely 0-1%, 1%-3% and 3%-5%, and thus the anti-island protection performance of the inverter can be reflected more objectively.

Moreover, in the existing detection of the anti-island protection performance of the inverter, the phenomenon that for two inverters with completely the same model number, one is qualified and the other is unqualified just resulting from inconsistent characteristics such as resistance, capacitance or inductance of the fundamental current flowing through the grid connection switch will occur. The inventor has found by researches that whether the fundamental current flowing through the grid connection switch represents resistance, capacitance or inductance is determined by the resonant frequency of the RLC load. With respect to the inverter cited in the application example of the present invention, when the load is resistive and when the resonant frequency is 50 Hz, the time for detecting the anti-island protection performance is the longest, when the load is capacitive or inductive, the resonant frequency deviates from 50 Hz and deviates from 50 Hz, and the further the resonant frequency deviating from 50 Hz is, the shorter the detection time is, namely the possibility of a qualified detection result is greater. Therefore, the present invention introduces the resonance change of the RLC load into the method for detecting the anti-island protection performance of the inverter to comprehensively detect the anti-island protection performance of the inverter.

Meanwhile, compared with the existing method for detecting the anti-island protection performance of the inverter, the fundamental current flowing through the grid connection switch is divided into three intervals, namely 0-1%, 1%-3% and 3%-5%, of the output current of the inverter, three load resonant frequency intervals representing resistance, capacitance and inductance are imported to serve as key test conditions, precise tests are performed on the anti-island ability of the inverter in the 9 test intervals, and the phenomenon that the anti-island ability of the inverter cannot be correctly reflected when some inverters are directed to a particular characteristic load design and some inverters are directed to various characteristic load designs can be effectively avoided. In the existing method for detecting the anti-island protection performance of the inverter, the detection results are all qualified or unqualified, and the abilities of the anti-island protection performance detection of inverters of two different model numbers cannot be objectively compared. According to the present invention, weighted comprehensive evaluation is performed on the 9 test results on the basis of precise detection, and the problem that the anti-island protection ability of the photovoltaic inverter is difficult to precisely evaluate is solved in the world for the first time.

The invention claimed is:

1. A method for detecting an anti-island protection performance of an inverter to be detected, wherein the inverter to be detected is connected to a power distribution network through a closed grid connection switch, and the method comprises the following steps:

step 1, serially connecting an RLC circuit between the inverter to be detected and the closed grid connection switch through a load switch, wherein a RLC load comprises an inductor, a capacitor and a resistor, which are connected in parallel, wherein the RLC circuit comprises the resistor, the inductor, and the capacitor;

step 2, setting initial conditions of detection, and setting fundamental current $I_1$ of the closed grid connection switch as smaller than 1% of output current $I_N$ of the inverter to be detected;

step 3, respectively setting a resonant frequency of the RLC load as three different numerical values for enabling the same to present resistance, capacitance and inductance; and recording a time value from a the disconnection of the closed grid connection switch to an operation stop of the inverter to be detected after every setting;

step 4, if any of the time values exceeds 2 seconds, determining the anti-island protection performance of the inverter to be detected as unqualified, and ending a detection;

if the time value does not exceed 2 seconds, respectively adjusting the fundamental current $I_1$ of the closed grid connection switch to $I_2$ and $I_3$; and repeating step 1 to step 3 after every adjustment, until a number of a recorded time values is 9, wherein 1% $I_N \leq I_2 < 3\% I_N$, 3% $I_N \leq I_3 < 5\% I_N$; and step 5, performing weighted calculation on the recorded 9 time values, wherein an obtained weighted value is a test result of an anti-island protection ability of the inverter to be detected, and performing grade evaluation on the anti-island protection ability of the inverter to be detected according to the test result.

2. The detection method of claim 1, wherein prior to step 2, the method comprises:

connecting a power test device between the closed grid connection switch and the power distribution network.

3. The detection method of claim 2, wherein the initial conditions of detection in step 2 further comprise:

2-1, measuring output values of active power and reactive power of the inverter to be detected by using the power detection device;

2-2, setting a reactive power value consumed by an LC circuit composed of an L branch and a C branch connected in parallel in the RLC circuit to be equal to the reactive power value emitted by the inverter to be detected; and setting an active power value consumed by the RLC circuit to be equal to the active power value emitted by the inverter to be detected, wherein the LC circuit comprises a second inductor, and a second capacitor; and 2-3, setting a quality factor of the RLC load as 1±0.2.

4. The detection method of claim 1, wherein the three different resonant frequency values of the RLC load in step 3 are respectively $f_1$ for enabling the RLC load to present resistance, $f_2$ for enabling the RLC load to present capacitance and $f_3$ for enabling the RLC load to present inductance; and 49.9 Hz≤$f_1$<50.1 Hz, 50.1 Hz≤$f_2$<50.2 Hz and 47.5 Hz≤$f_3$<49.9 Hz.

5. The detection method of claim 4, wherein the recording the time value from the disconnection of the closed grid connection switch to the operation stop of the inverter to be detected after every setting comprises:

3-1, when the resonant frequency value of the RLC load is $f_1$, disconnecting the closed grid connection switch, recording the time value from the disconnection of the closed grid connection switch to the operation stop of the inverter to be detected, and closing the closed grid connection switch;

3-2, when the resonant frequency value of the RLC load is $f_2$, disconnecting the closed grid connection switch, recording the time value from the disconnection of the closed grid connection switch to the operation stop of the inverter to be detected, and closing the closed grid connection switch; and 3-3, when the resonant frequency value of the RLC load is $f_3$, disconnecting the closed grid connection switch, recording the time value from the disconnection of the closed grid connection switch to the operation stop of the inverter to be detected, and closing the closed grid connection switch.

6. The detection method of claim 1, wherein the weighted value in step 5 is an average value or a root mean square value of the recorded 9 time values; and the smaller the weighted value is, the higher the grade evaluation of the anti-island protection ability of the inverter to be detected is.

* * * * *